United States Patent
Fukunaga et al.

(10) Patent No.: US 8,334,200 B2
(45) Date of Patent: Dec. 18, 2012

(54) SEMICONDUCTOR LIGHT-EMITTING DEVICE, METHOD OF MANUFACTURING SEMICONDUCTOR LIGHT-EMITTING DEVICE, AND LAMP

(75) Inventors: Naoki Fukunaga, Munakata (JP); Hiroshi Osawa, Chiba (JP)

(73) Assignee: Showa Denko K.K., Tokyo (JP)

( * ) Notice: Subject to any disclaimer, the term of this patent is extended or adjusted under 35 U.S.C. 154(b) by 182 days.

(21) Appl. No.: 12/296,849

(22) PCT Filed: Apr. 13, 2007

(86) PCT No.: PCT/JP2007/058193
§ 371 (c)(1), (2), (4) Date: Jan. 23, 2009

(87) PCT Pub. No.: WO2007/119830
PCT Pub. Date: Oct. 25, 2007

(65) Prior Publication Data
US 2009/0179220 A1    Jul. 16, 2009

(30) Foreign Application Priority Data
Apr. 14, 2006    (JP) .................. P2006-112012

(51) Int. Cl.
H01L 21/283    (2006.01)
H01L 21/441    (2006.01)

(52) U.S. Cl. .................. 438/609; 257/103; 257/E33.064

(58) Field of Classification Search .................. 438/609
See application file for complete search history.

(56) References Cited

U.S. PATENT DOCUMENTS

| | | | |
|---|---|---|---|
| 6,669,830 B1 * | 12/2003 | Inoue et al. | 204/298.13 |
| 2001/0008710 A1 * | 7/2001 | Takatsuji et al. | 428/689 |
| 2003/0146693 A1 * | 8/2003 | Ishihara et al. | 313/504 |
| 2006/0043419 A1 * | 3/2006 | Tachibana et al. | 257/200 |

FOREIGN PATENT DOCUMENTS

| | | |
|---|---|---|
| CN | 1741296 A | 3/2006 |
| JP | 62-22312 A | 1/1987 |
| JP | 05-299175 A | 11/1993 |
| JP | 2000-026119 A | 1/2000 |
| JP | 2002-164570 A | 6/2002 |
| JP | 2004-266258 A | 9/2004 |
| JP | 2005-123501 A | 5/2005 |

(Continued)

OTHER PUBLICATIONS

Tadatsugu Minami et al., "Preparation of transparent and conductive $In_2O_3$-ZnO films by radio frequency magnetron sputtering", J. Vac. Sci. Technol. A, May/Jun. 1996, pp. 1704-1708, vol. 14, No. 3.

(Continued)

Primary Examiner — Ha Tran T Nguyen
Assistant Examiner — Raj R Gupta
(74) Attorney, Agent, or Firm — Sughrue Mion, PLLC

(57) ABSTRACT

The present invention provides a semiconductor light-emitting device capable of effectively emitting ultraviolet light and a method of manufacturing the same. A semiconductor light-emitting device 1 includes: a p-type semiconductor layer 14; a semiconductor layer that has an emission wavelength in at least an ultraviolet range; and a transparent electrode 15 that is formed on the p-type semiconductor layer 14. The transparent electrode 15 includes a crystallized IZO film.

7 Claims, 6 Drawing Sheets

FOREIGN PATENT DOCUMENTS

| | | |
|---|---|---|
| JP | 2005-217331 A | 8/2005 |
| JP | 2005-259891 A | 9/2005 |
| WO | 01/38599 A1 | 5/2001 |
| WO | 2006/030762 A1 | 3/2006 |

OTHER PUBLICATIONS

Chinese Office Action (with translation) dated Nov. 2, 2011 for corresponding Chinese Patent Application No. 200780012867.7.

Japanese Office Action dated Jan. 10, 2012, issued in Japanese Patent Application No. 2006-112012.

Japanese Office Action (Decision of Rejection) dated Apr. 3, 2012 for corresponding Application No. 2006-112012.

Office Action issued Aug. 31, 2012 in corresponding Chinese Patent Application No. 200780012867.7.

Jae-Hong Lim et al.; "Low-resistivity and transparent indium-oxide-doped ZnO ohmic contact to p-type GaN"; Applied Physics Letters, vol. 85, No. 25; Dec. 20, 2004; pp. 6191-6193.

\* cited by examiner

SEMICONDUCTOR LIGHT-EMITTING DEVICE, METHOD OF MANUFACTURING SEMICONDUCTOR LIGHT-EMITTING DEVICE, AND LAMP

TECHNICAL FIELD

The present invention relates to a semiconductor light-emitting device, a method of manufacturing semiconductor light-emitting device, and a lamp including the same, and more particularly, to a semiconductor light-emitting device having high emission power Po of ultraviolet light, a method of manufacturing the same, and a lamp including the same.

Priority is claimed on Japanese Patent Application No. 2006-112012, filed Apr. 14, 2006, the content of which is incorporated herein by reference.

BACKGROUND ART

In recent years, gallium nitride compound semiconductor light-emitting devices have drawn attention as short wavelength light-emitting devices. The gallium nitride compound semiconductor light-emitting device is obtained by forming a gallium nitride compound semiconductor on various kinds of substrates, such as a sapphire single crystal substrate, an oxide substrate, and a group III-V compound substrate, by a metal organic chemical vapor deposition (MOCVD) method or a molecular beam epitaxy (MBE) method.

In the gallium nitride compound semiconductor light-emitting device, a small amount of current is diffused in the horizontal direction. Therefore, a current is applied to only a semiconductor immediately below an electrode, and light emitted from a light-emitting layer is shielded by the electrode, which makes it difficult to emit light from the light-emitting device to the outside. In order to solve this problem, in the gallium nitride compound semiconductor light-emitting device, a transparent electrode is generally used as a positive electrode, and light is emitted to the outside through the positive electrode.

In the related art, the transparent electrode has been formed of a known transparent conductive material, such as Ni/Au or ITO.

In recent years, the transparent electrode has generally been formed of an oxide material including, for example, $In_2O_3$ or ZnO having high translucency as a main ingredient. In ITO (indium tin oxide) that has been commonly used as a material forming the transparent electrode, $In_2O_3$ is doped with 5 to 20 percent by mass of $SnO_2$ to form a transparent conductive film having a specific resistance of about $2\times10^{-4}$ Ωcm.

Since the ITO film has a band gap of 3 eV or more, it has high transmittance with respect to light in the visible wavelength range (>90%). However, since the ITO film mainly absorbs light in a wavelength range of about 400 nm or less, the transmittance of the ITO film is rapidly reduced in the wavelength range of 400 nm or less. Therefore, when the ITO film is used as an electrode of a light-emitting device that emits light in an ultraviolet wavelength range, emission power is lowered.

In order to solve this problem, a light-emitting device has been proposed which prevents ultraviolet rays from being absorbed by a transparent electrode and converts the ultraviolet rays into visible light before the ultraviolet rays reach the transparent electrode (for example, see Patent Document 1).

In addition, in order to reduce the amount of light absorbed by the transparent electrode, a face-up light-emitting device including a through hole for light emission and an adhesive metal layer having high reflectance has been proposed (for example, see Patent Document 2).

[Patent Document 1] JP-A-5-299175
[Patent Document 2] JP-A-2005-123501

DISCLOSURE OF THE INVENTION

Problem that the Invention is to Solve

In Patent Document 1, since ultraviolet rays are converted into visible light before reaching the transparent electrode, it is difficult to obtain sufficiently high emission power of ultraviolet rays.

In the technique disclosed in Patent Document 2, since the transparent electrode is composed of an ITO film, the ITO film absorbs light in the ultraviolet wavelength range. Therefore, it is difficult to obtain sufficiently high emission power of ultraviolet rays.

The present invention has been made in order to solve the above problems, and an object of the present invention is to provide a semiconductor light-emitting device capable of effectively emitting ultraviolet light and a method of manufacturing the same.

Another object of the present invention is to provide a high-efficiency lamp including a semiconductor light-emitting device capable of effectively emitting ultraviolet light.

Means for Solving the Problems

The inventors have conceived the present invention in order to solve the above problems.

That is, the present invention is as follows.

According to a first aspect of the present invention, a semiconductor light-emitting device includes: a p-type semiconductor layer; a semiconductor layer that has an emission wavelength in at least an ultraviolet range; and a transparent electrode that is formed on the p-type semiconductor layer. The transparent electrode includes a crystallized IZO film.

According to a second aspect of the present invention, in the semiconductor light-emitting device according to the first aspect, preferably, an emission wavelength is in the wavelength range of 350 nm to 420 nm.

According to a third aspect of the present invention, in the semiconductor light-emitting device according to the first or second aspect, preferably, the thickness of the IZO film is in the range of 35 nm to 10 μm.

According to a fourth aspect of the present invention, in the semiconductor light-emitting device according to the third aspect, preferably, the thickness of the IZO film is in the range of 100 nm to 1 μm.

According to a fifth aspect of the present invention, in the semiconductor light-emitting device according to any one of the first to fourth aspects, preferably, a protective layer is formed on the IZO film.

According to a sixth aspect of the present invention, in the semiconductor light-emitting device according to any one of the first to fifth aspects, preferably, the semiconductor layer is a gallium nitride compound semiconductor layer.

According to a seventh aspect of the present invention, there is provided a method of manufacturing a semiconductor light-emitting device including a p-type semiconductor layer, a semiconductor layer having an emission wavelength in at least an ultraviolet range, and a transparent electrode formed on the p-type semiconductor layer and including a crystallized IZO film. The method includes the steps of: forming an amorphous IZO film on the p-type semiconductor layer; and performing an annealing process at a temperature in the range of 500° C. to 900° C. to change the amorphous IZO film into a crystallized IZO film.

According to an eighth aspect of the present invention, preferably, the method of manufacturing a semiconductor light-emitting device according to the seventh aspect further includes the step of: patterning the amorphous IZO film before the annealing process.

According to a ninth aspect of the present invention, in the method of manufacturing a semiconductor light-emitting device according to the seventh or eighth aspect, preferably, the annealing process is performed in an atmosphere without $O_2$.

According to a tenth aspect of the present invention, in the method of manufacturing a semiconductor light-emitting device according to the ninth aspect, preferably, the annealing process is performed in a $N_2$ atmosphere or a mixed gas atmosphere of $N_2$ and $H_2$.

According to an eleventh aspect of the present invention, in the method of manufacturing a semiconductor light-emitting device according to any one of the seventh to tenth aspects, preferably, the thickness of the IZO film is in the range of 35 nm to 10 µm.

According to a twelfth aspect of the present invention, in the method of manufacturing a semiconductor light-emitting device according to the eleventh aspect, preferably, the thickness of the IZO film is in the range of 100 nm to 1 µm.

According to a thirteenth aspect of the present invention, preferably, the method of manufacturing a semiconductor light-emitting device according to any one of the seventh to twelfth aspects further includes the step of: forming a protective layer on the IZO film after the annealing process.

According to a fourteenth aspect of the present invention, a lamp includes the semiconductor light-emitting device according to any one of the first to sixth aspects.

Advantages of the Invention

In the semiconductor light-emitting device according to the present invention, since a transparent electrode includes a crystallized IZO (indium tin oxide) film, the transparent electrode has high a transmittance for light in the ultraviolet wavelength range. Specifically, the crystallized IZO film has a higher transmittance for light in a wavelength range of about 400 nm, which is an ultraviolet range, as compared to the ITO film. Therefore, in the semiconductor light-emitting device according to the present invention, the amount of light in the ultraviolet wavelength range absorbed by the transparent electrode is small, and it is possible to effectively emit ultraviolet light. Therefore, the semiconductor light-emitting device can improve the emission power of the ultraviolet light.

Further, according to a method of manufacturing a semiconductor light-emitting device of the present invention, after an amorphous IZO film is formed on the p-type semiconductor layer, an annealing process is performed on the IZO film at a temperature in the range of 500° C. to 900° C. Therefore, it is possible to achieve a semiconductor light-emitting device that has a transparent electrode including the crystallized IZO film and is capable of effectively emitting ultraviolet light.

In addition, when the semiconductor light-emitting device according to the present invention is used for a lamp, it is possible to obtain a lamp having high emission characteristics.

BRIEF DESCRIPTION OF THE DRAWINGS

FIG. 8A is a cross-sectional view schematically illustrating the first process of forming a n-type semiconductor layer 12, a light emitting layer 13 and a p-type semiconductor layer 14 on a substrate 11, FIG. 8B is a cross-sectional view schematically illustrating the process of forming a light permeable electrode (IZO film) 15 on the p-type semiconductor layer 14, FIG. 8C is a cross-sectional view schematically illustrating the patterning process of the light permeable film, FIG. 8D is a cross-sectional view schematically illustrating the annealing process of the patterned light permeable film and FIG. 8E is a cross-sectional view schematically illustrating the process of covering the light permeable film with a protective film 18.

BEST MODE FOR CARRYING OUT THE INVENTION

Hereinafter, a semiconductor light-emitting device, a method of manufacturing a semiconductor light-emitting device, and a lamp using a semiconductor light-emitting device according to exemplary embodiments of the present invention will be described with reference to the accompanying drawings.

Figure 1:
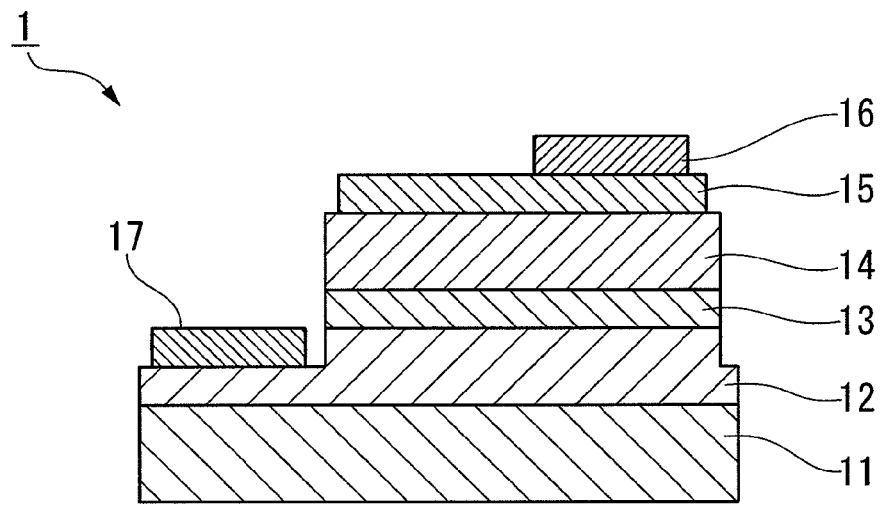
FIG. 1 is a cross-sectional view schematically illustrating an example of a semiconductor light-emitting device according to the present invention.
Figure 2:
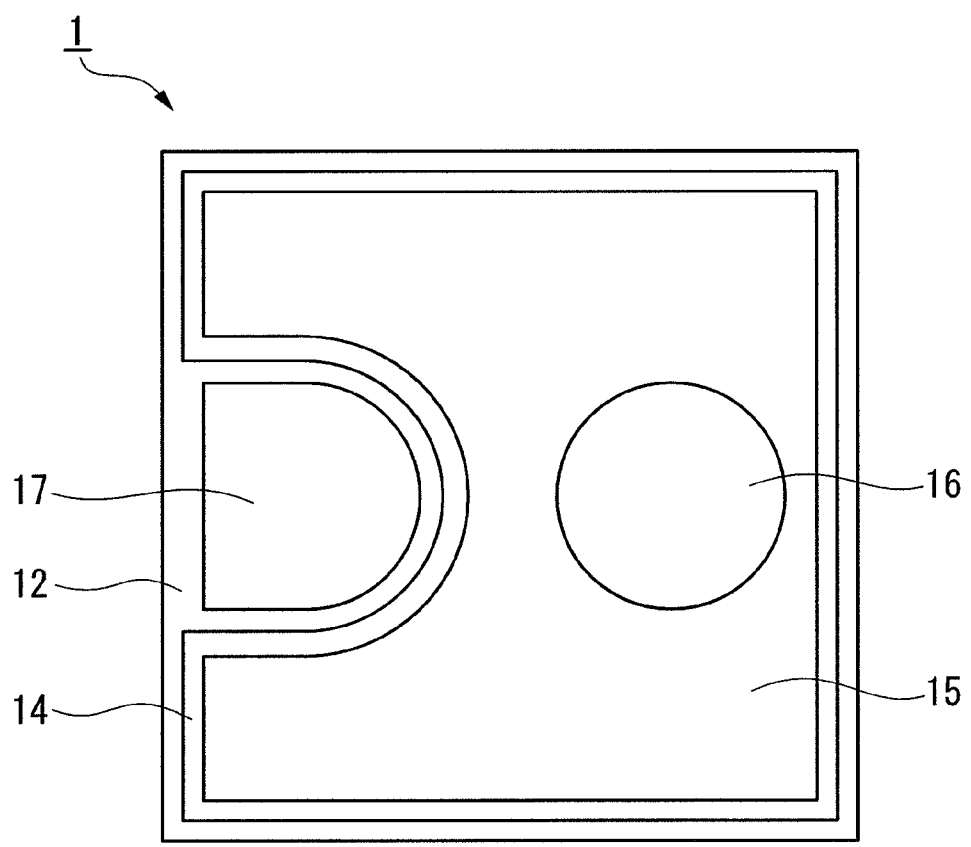
FIG. 2 is a plan view schematically illustrating the semiconductor light-emitting device shown in FIG. 1.

FIG. 1 is a cross-sectional view schematically illustrating an example of a semiconductor light-emitting device according to the present invention, and FIG. 2 is a plan view schematically illustrating the semiconductor light-emitting device shown in FIG. 1.

A semiconductor light-emitting device 1 shown in FIG. 1 is a face-up type, and has a schematic structure in which an n-type GaN layer (n-type semiconductor layer) 12, a light-emitting layer 13, and a p-type GaN layer (p-type semiconductor layer) 14 forming a gallium nitride compound semiconductor layer having an emission wavelength in an ultraviolet range are laminated on a substrate 11, a positive electrode 15 (transparent electrode) composed of a crystallized IZO film is formed on the p-type GaN layer 14 of the gallium nitride compound semiconductor layer, a positive electrode bonding pad 16 is formed on a portion of the positive electrode 15, and a negative electrode bonding pad 17 is formed on a negative electrode forming region of the n-type GaN layer 12.

Next, components of the semiconductor light-emitting device according to the present invention will be described in detail.

(Substrate)

The substrate 11 may be formed of any known substrate materials including oxide single crystals, such as sapphire single crystal ($Al_2O_3$; an A-plane, a C-plane, an M-plane, or an R-plane), spinel single crystal ($MgAl_2O_4$), ZnO single crystal, $LiAlO_2$ single crystal, $LiGaO_2$ single crystal, MgO single crystal, Si single crystal, SiC single crystal, GaAs single crystal, AlN single crystal, GaN single crystal, or boride single crystal, such as $ZrB_2$.

In addition, the plane direction of the substrate is not particularly limited. As the substrate, a just substrate or an off-angle substrate may be used.

(Gallium Nitride Compound Semiconductor Layer)

The n-type GaN layer 12, the light-emitting layer 13, and the p-type GaN layer (p-type semiconductor layer) 14 may have various known structures without any restrictions. In particular, a p-type semiconductor layer having a general carrier concentration may be used, and the transparent positive electrode 15, which is the crystallized IZO film forming the structure according the present invention, may be applied even when a p-type GaN layer having a relatively low carrier concentration of, for example, about $1\times10^{17}$ cm$^{-3}$ is used.

As the gallium nitride compound semiconductor, semiconductors having various compositions, which are represented by the general formula $Al_xIn_yGa_{1-x-y}N$ ($0\leqq x<1$, $0\leqq y<1$, and $0\leqq x+y<1$), have been known. In the present invention, any of the semiconductors having various compositions, which are represented by the general formula $Al_xIn_yGa_{1-x-y}N$ ($0\leqq x<1$, $0\leqq y<1$, and $0\leqq x+y<1$), may be used as the gallium nitride compound semiconductors forming the n-type GaN layer, the light-emitting layer, or the p-type GaN layer according to the present invention, without any restrictions.

The method of growing the gallium nitride compound semiconductor is not particularly limited. For example, any method of growing a group-III nitride semiconductor, such as an MOCVD (metal organic chemical vapor deposition) method, an HVPE (hydride vapor phase epitaxy) method, or an MBE (molecular beam epitaxy) method, may be used to grow the gallium nitride compound semiconductor. The MOCVD method is preferable in terms of the control of the thickness of a film and mass production.

In the MOCVD method, hydrogen ($H_2$) or nitrogen ($N_2$) is used as a carrier gas, trimethylgallium (TMG) or triethylgallium (TEG) is used as a Ga source, which is a group-III element, trimethylaluminum (TMA) or triethyl aluminum (TEA) is used as an Al source, trimethylindium (TMI) or triethylindium (TEI) is used as an In source, and ammonium ($NH_3$) or hydrazine ($N_2H_4$) is used as a nitrogen (N) source, which is a group-V element. In addition, for example, Si-based materials, such as monosilane ($SiH_4$) and disilane ($Si_2H_6$), and Ge-based materials, such as germane ($GeH_4$), are used as n-type dopants, and Mg-based materials, such as bis-cyclopentadienylmagnesium ($Cp_2Mg$) and bisethylcyclopentadienyl magnesium (($EtCp)_2Mg$), are used as p-type dopants.

Figure 3:
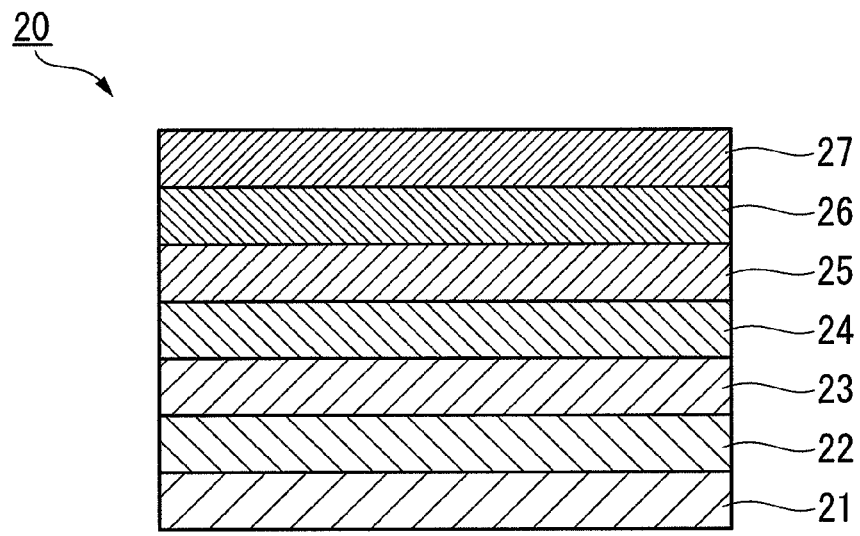
FIG. 3 is a cross-sectional view schematically illustrating an example of a gallium nitride compound semiconductor layer.

As an example of the gallium nitride compound semiconductor layer including the gallium nitride compound semiconductors, a gallium nitride compound semiconductor layer 20 having the laminated structure shown in FIG. 3 may be used. In the gallium nitride compound semiconductor layer 20 shown in FIG. 3, a buffer layer (not shown) made of AlN is formed on a substrate 21 made of sapphire, and a GaN underlying layer (n-type semiconductor layer) 22, an n-type GaN contact layer (n-type semiconductor layer) 23, an n-type AlGaN clad layer (n-type semiconductor layer) 24, a light-emitting layer 25 made of InGaN, a p-type AlGaN clad layer (p-type semiconductor layer) 26, and a p-type GaN contact layer (p-type semiconductor layer) 27 are sequentially formed on the buffer layer.

(Positive Electrode (IZO Film))

As shown in FIG. 1, a crystallized IZO film is formed as the positive electrode 15 on the p-type GaN layer 14. The IZO film is directly formed on the p-type GaN layer 14, or it is formed on the p-type GaN layer 14 with a metal layer interposed therebetween. When the metal layer is interposed between the positive electrode 15 and the p-type GaN layer 14, it is possible to reduce the driving voltage Vf of the semiconductor light-emitting device 1, but the transmittance of the semiconductor light-emitting device is lowered, which results in a reduction in output. Therefore, it is necessary to keep a balance between the driving voltage (Vf) and the output of the semiconductor light-emitting device 1 according to the purpose of use, and it is appropriately determined whether to interpose the metal layer between the positive electrode 15 and the p-type GaN layer 14. The metal layer may be formed of, Ni, a Ni oxide, Pt, Pd, Ru, Rh, Re, or Os.

It is preferable that the IZO film be formed of a composition having the lowest specific resistance. For example, the concentration of ZnO in the IZO film is preferably in the range of 5 to 15 percent by mass, more preferably, 10 percent by mass.

The thickness of the IZO film is preferably in the range of 35 nm to 10000 nm (10 μm), more preferably, 100 nm to 1 μm in order to obtain a low specific resistance and a high transmittance. Further, it is preferable that the thickness of the IZO film be less than or equal to 1000 nm (1 μm) in order to reduce manufacturing costs.

Next, a method of forming the IZO film will be described.

First, an amorphous IZO film is formed on the entire surface of the p-type GaN layer 14. Any known thin film forming method may be used to form the IZO film as long as it can form an amorphous IZO film. For example, a sputtering method or a vapor deposition method may be used to form a film. It is preferable to use the sputtering method since it generates a smaller amount of particles or dust than the vapor deposition method. When the sputtering method is used, it is possible to revolute an $In_2O_3$ target and a ZnO target using an RF magnetron sputtering method to form a film. However, in order to further increase the deposition rate, it is preferable to form a film with an IZO target using a DC magnetron sputtering method. In addition, in order to reduce the damage of the p-type GaN layer 14 due to plasma, it is preferable that the discharge output of a sputter be less than or equal to 1000 W.

In the amorphous IZO film formed on the p-type GaN layer 14, regions other than positive electrode forming regions for forming the positive electrode 15 are patterned by known photolithography and etching methods. As a result, the amorphous IZO film is formed only on the positive electrode forming region, as shown in FIG. 2.

It is preferable that the IZO film be patterned before an annealing process, which will be described below. The annealing process changes the amorphous IZO film into a crystallized IZO film, and it is difficult to etch the crystallized IZO film, as compared to the amorphous IZO film. In contrast, since the IZO film before the annealing process is in an amorphous state, it is possible to easily and accurately etch the film with a known etchant. In addition, a dry etching apparatus may be used to etch the IZO film.

In this embodiment, after the IZO film is patterned, annealing is performed at a temperature in the range of 500° C. to 900° C. to change the amorphous IZO film into a crystallized IZO film (annealing process). The crystallized IZO film makes it possible to improve the transmittance of light in an ultraviolet wavelength range (350 nm to 420 nm). It is considered that the crystallized IZO film makes it possible to improve the transmittance of light in an ultraviolet wavelength range since the band gap of the IZO film is widened by crystallization.

It is preferable that the annealing process be performed on the IZO film in an atmosphere without $O_2$. Examples of the atmosphere without $O_2$ include an inert atmosphere, such as a $N_2$ atmosphere and a mixed gas atmosphere of inert gases, such as $N_2$, and $H_2$. It is preferable that the annealing process be performed in the $N_2$ atmosphere or the mixed gas atmosphere of $N_2$ and $H_2$. When the annealing process is performed on the IZO film in the $N_2$ atmosphere or the mixed gas atmosphere of $N_2$ and $H_2$, it is possible to crystallize the IZO film, and effectively reduce the sheet resistance of the IZO film. In particular, in order to reduce the sheet resistance of the IZO film, it is preferable to perform the annealing process on the IZO film in the mixed gas atmosphere of $N_2$ and $H_2$. The ratio of $N_2$ and $H_2$ in the mixed gas atmosphere is preferably in the range of 100:1 to 1:100.

On the other hand, when the annealing process is performed in, for example, an atmosphere including $O_2$, the sheet resistance of the IZO film is increased. It is considered that the reason why the sheet resistance of the IZO film is increased when the annealing process is performed in the atmosphere including $O_2$ is that oxygen vacancies in the IZO film are reduced. The reason why the IZO film has conductivity is that the oxygen vacancies in the IZO film generate electrons serving as a carrier. Therefore, when the annealing process is performed in the atmosphere including $O_2$, the oxygen vacancies, which are a source for generating carrier electrons, are reduced, and the carrier concentration of the IZO film is lowered, which results in an increase in the sheet resistance.

Furthermore, the IZO film is annealed at a temperature in the range of 500° C. to 900° C. When the annealing temperature is lower than 500° C., the IZO film may not be sufficiently crystallized, and the transmittance of the IZO film may not be sufficiently increased in the ultraviolet range. When the annealing temperature is higher than 900° C., the semiconductor layer below the IZO film may deteriorate.

In this embodiment, annealing is performed to crystallize the IZO film, but the present invention is not limited thereto. In the semiconductor light-emitting device according to the present invention, any method may be used as long as it can crystallize the IZO film. For example, a method of using an RTA annealing furnace, a laser annealing method, and an electron beam radiating method may be used.

The positive electrode 15 composed of the crystallized IZO film is effective to increase the light emission efficiency of a semiconductor light-emitting device having a central wavelength in the ultraviolet range (350 nm to 420 nm). For example, the positive electrode can improve the light emission efficiency of a semiconductor light-emitting device having a light emission range of 350 nm to 420 nm and a central wavelength in a blue wavelength range of 450 nm.

Since the adhesion of the IZO film crystallized by the annealing process to the p-type GaN layer 14 or the positive electrode bonding pad 16 is higher than that of the amorphous IZO film, it is possible to prevent yield from being reduced due to the peeling-off of the IZO film during a manufacturing process of the semiconductor light-emitting device. In addition, since the crystallized IZO film does not react well with water in the air, characteristics of the crystallized IZO film are hardly deteriorated in an endurance test for a long time, which is preferable.

(Negative Electrode)

After the IZO film is annealed, the negative electrode 17 is formed on the n-type GaN layer 12 that is exposed by partially etching the p-type GaN layer 14, the light-emitting layer 13, and the n-type GaN layer 12, as shown in FIG. 1. The negative electrode 17 is formed of materials having various known compositions and structures, such as Ti/Au, and the present invention can use any of the known negative electrodes.

(Positive Electrode Bonding Pad)

The positive electrode bonding pad 16 for electrical connection to, for example, a circuit board or a lead frame is formed on a portion of the positive electrode 15 composed of the IZO film. The positive electrode bonding pad 16 has various known structures made of, for example, Au, Al, Ni, and Cu. However, the material and the structure of the positive electrode bonding pad are not limited thereto. It is preferable that the thickness of the positive electrode bonding pad 16 be in the range of 100 to 1000 nm. The bonding pad is characterized in that, as the thickness of the positive electrode bonding pad increases, the bondability thereof is improved. Therefore, it is more preferable that the thickness of the positive electrode bonding pad 16 be greater than or equal to 300 nm. In addition, it is most preferable that the thickness of the positive electrode bonding pad 16 be less than or equal to 500 nm in order to reduce manufacturing costs.

(Protective Layer)

It is preferable that a protective layer (not shown) be formed so as to cover substantially the entire surface of the IZO film other than a region for forming the positive electrode bonding pad 16, in order to prevent the IZO film from being oxidized. The protective layer is preferably formed of an insulating material in order to prevent current leakage between the p-type semiconductor layer and the n-type semiconductor layer. For example, the protective layer may be formed of $SiO_2$ or $Al_2O_3$. The protective layer may have a sufficient thickness to prevent the IZO film from being oxidized and to ensure high transmittance. For example, the thickness of the protective layer is preferably in the range of 20 nm to 500 nm.

[Lamp]

For example, a known means may be used to mount a transparent cover to the semiconductor light-emitting device according to the present invention, thereby forming a lamp. In addition, it is possible to form a white lamp by combining the semiconductor light-emitting device according to the present invention with a cover including a phosphor.

For example, the semiconductor light-emitting device according to the present invention may be used to form an LED lamp by any known method. The semiconductor light-emitting device may be used for various types of lamps, such as a general-purpose bomb-shaped lamp, a side view lamp for a backlight of a mobile phone, and a top view lamp used for a display device.

Figure 4:
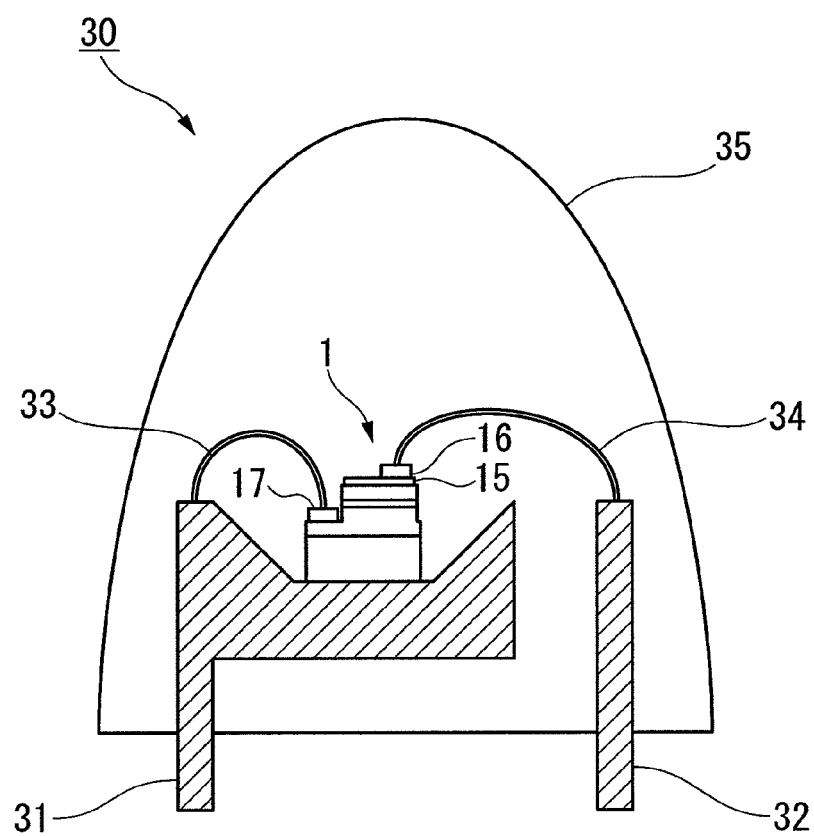
FIG. 4 is a cross-sectional view schematically illustrating a lamp including the semiconductor light-emitting device according to the present invention.

FIG. 4 is a diagram schematically illustrating the structure of an example of the lamp according to the present invention. A lamp 30 shown in FIG. 4 is a bomb-shaped lamp having a face-up semiconductor light-emitting device according to the present invention mounted thereto. In the lamp 30 shown in FIG. 4, the semiconductor light-emitting device 1 shown in FIG. 1 is adhered to one of two frames 31 and 32 by, for example, resin, and the positive electrode bonding pad 16 and the negative electrode 17 are bonded to the frames 31 and 32 by wires 33 and 34 formed of, for example, gold, respectively. Then, as shown in FIG. 4, a mold 35 made of a transparent resin is formed in the periphery of the semiconductor light-emitting device 1.

The present invention is not limited to the above-described embodiment. For example, the semiconductor layer provided in the semiconductor light-emitting device according to the present invention is not limited to the above-mentioned gallium nitride compound semiconductor layer. However, any light-emitting device may be used as long as it has an emission wavelength in at least an ultraviolet range.

Experimental Example 1

Atmosphere in Annealing Process of IZO Film

The relationship between the atmosphere in the annealing process of the IZO film and the sheet resistance of the IZO film after the annealing process was examined as follows.

That is, an amorphous IZO film (250 nm) was formed on a glass substrate, and annealing was performed on the obtained IZO film at a temperature in the range of 300° C. to 600° C. in a $N_2$ atmosphere. Then, the sheet resistance of the IZO film was measured. In addition, annealing was performed on the same IZO film in the same temperature range in a mixed gas atmosphere including $N_2$ and 25% of $O_2$, and then the sheet resistance of the IZO film was measured. The measured results are shown in Table 1.

TABLE 1

| Temperature | Sheet resistance [Ω/sq] | |
| --- | --- | --- |
| | $N_2$ atmosphere including $O_2$ | $N_2$ atmosphere |
| 300° C. | 15 | 13 |
| 400° C. | 150 | 13 |
| 500° C. | 200 | 12 |
| 600° C. | $7 \times 10^5$ | 9 |

As can be seen from Table 1, when the annealing process is performed in the mixed gas atmosphere including $N_2$ and $O_2$, as the annealing temperature is increased, the sheet resistance is increased. In contrast, when the annealing process is performed in the $N_2$ atmosphere without $O_2$, as the annealing temperature is increased, the sheet resistance is decreased. In addition, the sheet resistance of the amorphous IZO film with a thickness of 250 nm before the annealing process was 15 Ω/sq.

Experimental Example 2

Annealing Temperature of IZO Film

The relationship between the annealing temperature of the IZO film and the crystallization of the IZO film was examined.

That is, an amorphous IZO film (250 nm) was formed on a glass substrate, and the state of the obtained IZO film not subjected to an annealing process was measured by an X-ray diffraction (XRD) method. In addition, an annealing process was performed on the amorphous IZO film formed on the glass substrate at a temperature in the range of 300° C. to 800° C. in a $N_2$ atmosphere for one minute, and then the state of the IZO film after the annealing process was measured by an X-ray diffraction (XRD) method. The measured results are shown in FIG. 5.

Figure 5:
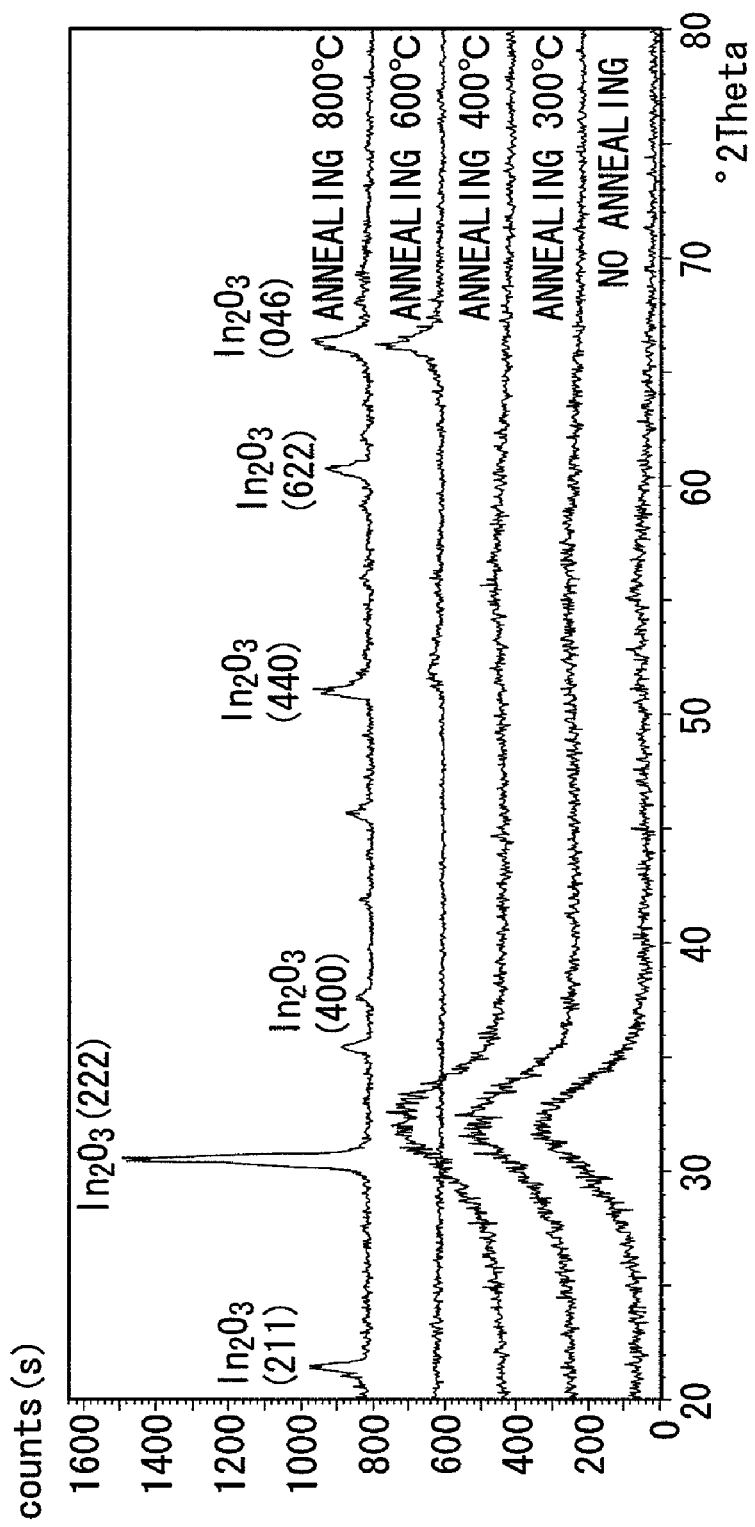
FIG. 5 is a graph illustrating the X-ray diffraction (XRD) result of an IZO film.

FIG. 5 is a graph illustrating the X-ray diffraction (XRD) results of the IZO film, in which the horizontal axis indicates a diffraction angle (2θ(°)) and the vertical axis indicates analysis strength.

As shown in FIG. 5, when the annealing process is performed on the IZO film at a temperature of 600° C. or more, the peak of X-rays composed of $In_2O_3$ is mainly detected, and the IZO film is crystallized. In addition, when the annealing process is performed on the IZO film at a temperature of 400° C. or less, the IZO film is not crystallized.

Experimental Example 3

Transmittance of IZO Film

The relationship between the annealing temperature of the IZO film and the transmittance of the IZO film after an annealing process was examined.

That is, the transmittance of the IZO film not subjected to an annealing process, which was obtained in Experimental example 2, and the transmittances of the IZO films after the annealing process at 300° C. and 600° C. were measured. The measured results are shown in FIG. 6.

In addition, a UV-visible spectrophotometer (UV-2450 manufactured by Shimadze Corporation) was used to measure the transmittance of the IZO film. The transmittance value was obtained by subtracting the blank value of the transmittance of a glass substrate.

Figure 6:
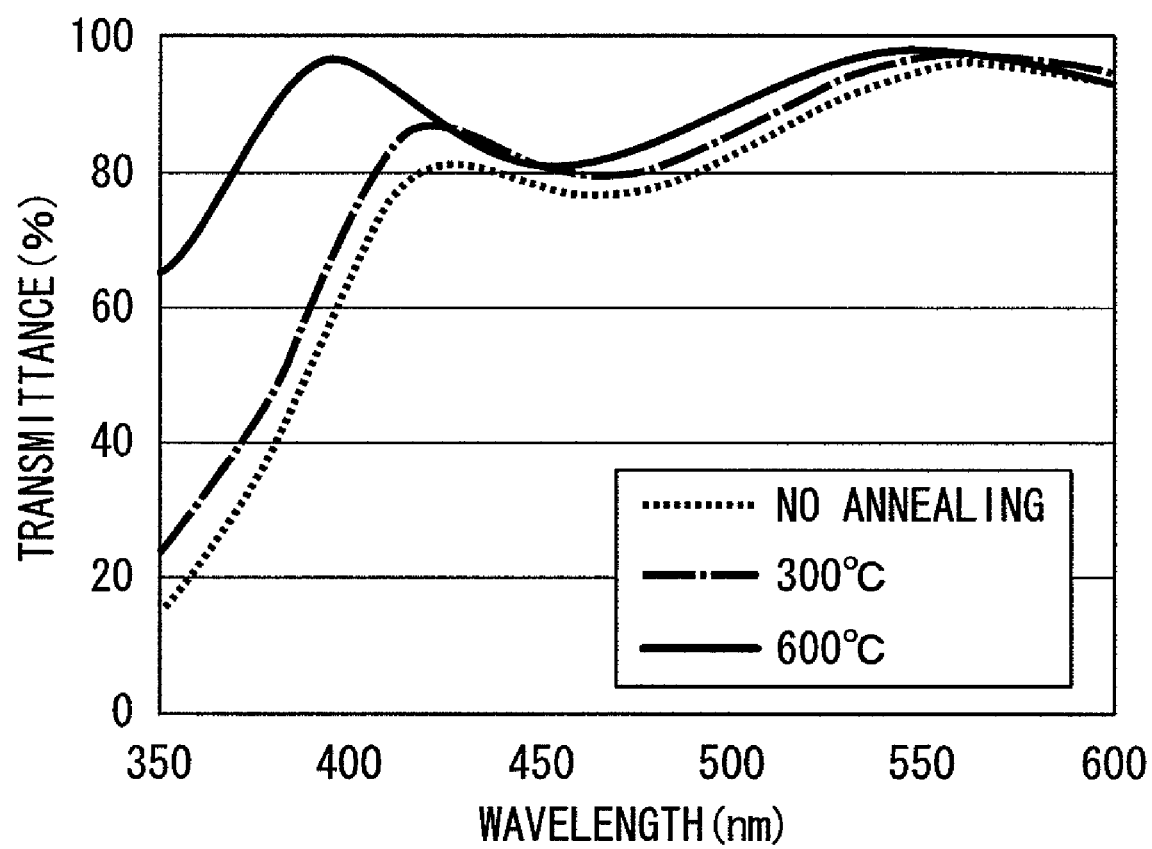
FIG. 6 is a graph illustrating the transmittance of the IZO film.
Figure 7:
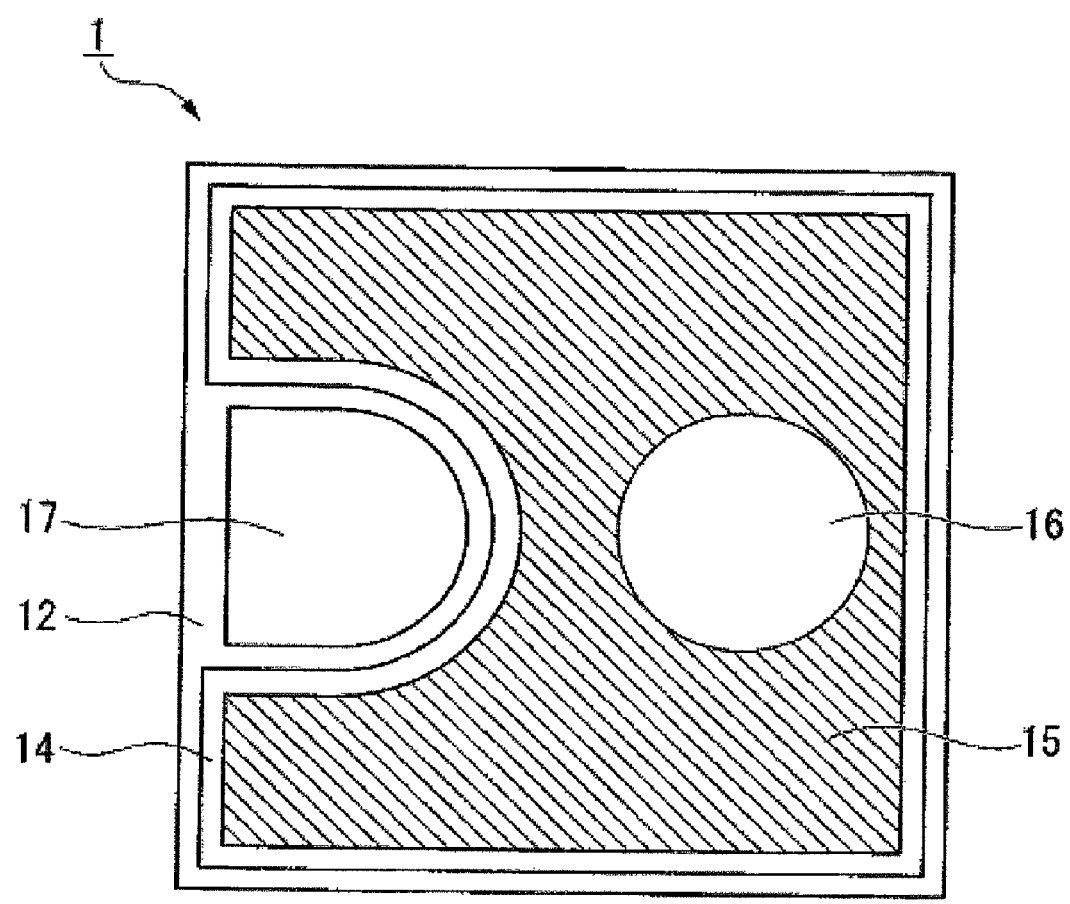
FIG. 7 is a plan view schematically illustrating the hatched area where the transparent electrode 15 is formed in the semiconductor light-emitting device 1 shown in FIG. 1, and further illustrating n-type semiconductor layer 12, p-type semiconductor layer 14, positive electrode bonding pad 16 and negative electrode bonding pad 17.
Figure 8A:
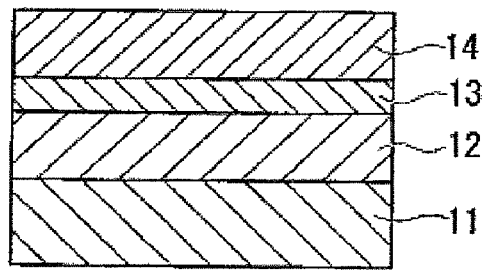
FIGS. 8A-8E are cross-sectional views schematically illustrating the patterning step of amorphous IZO electrode formation, where
Figure 8B:
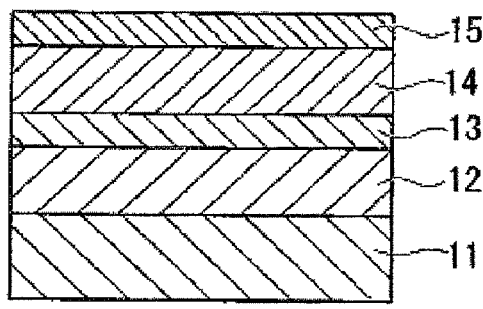
Figure 8C:
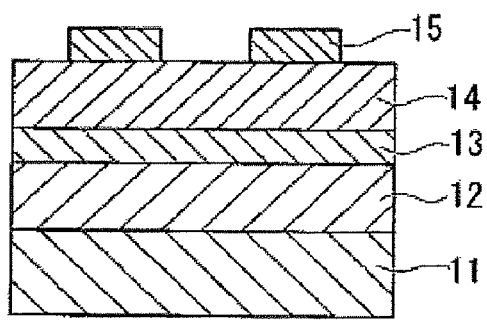
Figure 8D:
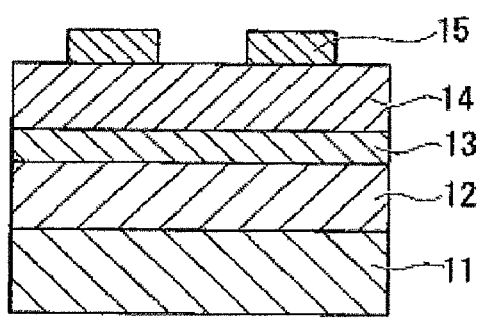
Figure 8E:
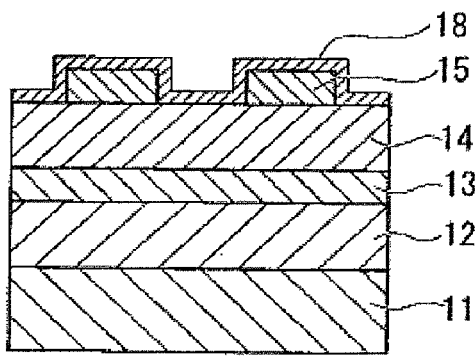

FIG. 6 is a graph illustrating the transmittance of the IZO film, in which the horizontal axis indicates a wavelength (nm) and the vertical axis indicates the transmittance (%).

As can be seen from FIG. 6, when the annealing process is performed on the IZO film at a temperature of 600° C., the transmittance of the IZO film in an ultraviolet range (350 nm to 420 nm) is 20 to 30% higher than that of the IZO film not subjected to the annealing process.

Example 1

Manufacture of Gallium Nitride Compound Semiconductor Layer

The gallium nitride compound semiconductor layer 20 shown in FIG. 3 was manufactured as follows. The gallium nitride compound semiconductor layer was manufactured by sequentially laminating, on a c-plane ((0001) crystal surface) sapphire substrate 21, an undoped GaN underlying layer (thickness=2 μm) 22, a Si-doped n-type GaN contact layer (thickness=2 μm, and carrier concentration=$1 \times 10^{19}$ cm$^{-3}$) 23, a Si-doped n-type $Al_{0.07}Ga_{0.93}N$ clad layer (thickness=12.5 nm, and carrier concentration=$1 \times 10^{18}$ cm$^{-3}$) 24, a light-emitting layer 25 having a multiple quantum structure of 6 Si-doped GaN barrier layers (thickness=14.0 nm, and carrier concentration=$1 \times 10^{18}$ cm$^{-3}$) and 5 undoped $In_{0.20}Ga_{0.80}N$ well layers (thickness=2.5 nm), a Mg-doped p-type $Al_{0.07}Ga_{0.93}N$ clad layer (thickness=10 nm) 26, and a Mg-doped p-type GaN contact layer (thickness=100 nm) 27, with a buffer layer (not shown) formed of AlN interposed therebetween. The layers 22 to 27 of the laminated structure of the gallium nitride compound semiconductor layer 20 were grown by a general low pressure MOCVD device.

(Manufacture of Semiconductor Light-Emitting Device)

Then, the gallium nitride compound semiconductor layer 20 shown in FIG. 3 was used to manufacture a gallium nitride compound semiconductor light-emitting device. First, HF and HCl were used to clean the surface of the p-type GaN contact layer 27 of the gallium nitride compound semiconductor layer 20, and an IZO film was formed with a thickness of 220 nm on the p-type GaN contact layer 27 by a DC magnetron sputter.

In the sputtering of the IZO film, an IZO target having an IZO concentration of 10% by mass was used. The IZO film was formed under the conditions of an Ar flow rate of 70 sccm and a pressure of about 0.3 Pa.

The IZO film manufactured by the above-mentioned method had a transmittance of about 60% in a wavelength range of about 400 nm, and the sheet resistance thereof was 17 $\Omega$/sq. In addition, an X-ray diffraction (XRD) method was used to measure the state of the IZO film formed by the above-mentioned method, and the result proved that the IZO film was in an amorphous state.

Then, the amorphous IZO film was patterned by a photolithography technique and wet etching such that the IZO film was formed only on a region for forming a positive electrode of the p-type GaN contact layer 27. The amorphous IZO film was etched at an etching rate of about 40 nm/min.

After the patterning process, the IZO film was annealed in an RTA annealing furnace in a $N_2$ gas atmosphere at a temperature of 600° C. for one minute.

The IZO film subjected to the annealing process had high transmittance in a wavelength range of about 400 nm and a transmittance of 90% or more in a wavelength range of 400 nm. In addition, the sheet resistance of the IZO film was 14 $\Omega$/sq. Further, after the annealing process, an X-ray diffraction (XRD) method was used to measure the state of the IZO film, and the measured results showed that the peak of X-rays composed of $In_2O_3$ was mainly detected and the IZO film was crystallized.

Then, dry etching was performed on a region for forming an n-type electrode to expose the surface of the Si-doped n-type GaN contact layer 23 only in the region. Then, a first layer (thickness=40 nm) made of Cr, a second layer (thickness=100 nm) made of Ti, and a third layer (thickness=400 nm) made of Au were sequentially formed on a portion of the IZO film (positive electrode) and the Si-doped n-type GaN contact layer 23 by a vacuum deposition method, thereby forming the positive electrode bonding pad and the negative electrode. After the positive electrode bonding pad and the negative electrode were formed, the rear surface of the substrate 11 formed of sapphire was polished into a mirror surface by polishing particles, such as diamond particles.

Then, the laminated structure was cut into individual square chips each having a 350 μm square, thereby obtaining a semiconductor light-emitting device.

(Measurement of Driving Voltage Vf and Emission Power Po)

The manufactured semiconductor light-emitting device (chip) was mounted to the lead frame, and then connected to the lead frame by gold (Au) lines. Then, a probe contacted the chip and a current of 20 mA was applied to the semiconductor light-emitting device to measure a forward voltage (driving voltage: Vf). In addition, the emission power Po and the emission wavelength were measured by a general integrating sphere.

It was found that light was emitted from the entire surface of the positive electrode. In addition, the semiconductor light-emitting device had an emission wavelength in a wavelength range of about 400 nm, and the driving voltage Vf and the emission power Po of the semiconductor light-emitting device were 3.3 V and 15 mW, respectively.

Example 2

A semiconductor light-emitting device was manufactured, similar to Example 1, except that a mixed gas of $N_2$ and $H_2$ was used for an annealing process. The IZO film immediately after the annealing process had a transmittance of 90% or more in a wavelength range of about 400 nm and a sheet resistance of 11 $\Omega$/sq. The obtained semiconductor light-emitting device had an emission wavelength in the wavelength range of about 400 nm, and the driving voltage Vf and the emission power Po of the semiconductor light-emitting device were 3.25 V and 15 mW, respectively.

Comparative Example 1

A semiconductor light-emitting device was manufactured, similar to Example 1, except that an annealing process was performed at a temperature of 300° C. The IZO film after the annealing process had a transmittance of about 70% in a wavelength range of about 400 nm and a sheet resistance of 16 $\Omega$/sq. The obtained semiconductor light-emitting device had an emission wavelength in the wavelength range of about 400 nm, and the driving voltage Vf and the emission power Po of the semiconductor light-emitting device were 3.3 V and 12 mW, respectively.

Comparative Example 2

Similar to Example 1, an ITO film with a thickness of 250 nm was formed on the p-type GaN contact layer 27 of the gallium nitride compound semiconductor layer 20 by a sputtering method. Then, wet etching was performed on the amorphous IZO film using a liquid mixture of $FeCl_3$ and HCl to form the IZO film only on a region for forming a positive electrode of the p-type GaN contact layer 27. After patterning the IZO film, a two-stage annealing process was performed on the IZO film. That is, an annealing process was performed on the IZO film in a $N_2$ gas atmosphere including 25% of $O_2$ at a temperature of 600° C. for one minute, and then another annealing process was performed on the IZO film in a $N_2$ atmosphere at a temperature of 500° C. for one minute. The IZO film after the two-stage annealing process had a transmittance of about 80% in a wavelength range of about 400 nm and a sheet resistance of 15 $\Omega$/sq.

After the two-stage annealing process, a semiconductor light-emitting device was manufactured, similar to Example 1. The obtained semiconductor light-emitting device had an emission wavelength in the wavelength range of about 400 nm, and the driving voltage Vf and the emission power Po of the semiconductor light-emitting device were 3.3 V and 13 mW, respectively.

Examples 1 and 2 and Comparative examples 1 and 2 showed that, in the semiconductor light-emitting devices according to Example 1 and Example 2 in which the annealing process was performed on the IZO film forming the positive electrode, the IZO film had higher transmittance and lower sheet resistance than that in the semiconductor light-emitting devices according to Comparative example 1 and Comparative example 2.

Further, in the semiconductor light-emitting devices according to Example 1 and Example 2, the emission power Po of light in the ultraviolet range was higher than that in the semiconductor light-emitting devices according to Comparative examples 1 and 2.

INDUSTRIAL APPLICABILITY

The present invention can be applied to a semiconductor light-emitting device, a method of manufacturing a semiconductor light-emitting device, and a lamp including the same. Particular, the present invention can be applied to a semiconductor light-emitting device having high emission power Po of ultraviolet light, a method of manufacturing the same, and a lamp including the same.

The invention claimed is:

1. A method of manufacturing a semiconductor light-emitting device including a p-type semiconductor layer, a semiconductor layer having an emission wavelength in at least an ultraviolet range, and a transparent electrode formed on the p-type semiconductor layer and including a crystallized IZO film, the method comprising the steps of:
    forming an amorphous IZO film on the p-type semiconductor layer; and
    performing an annealing process at a temperature in the range of 500° C. to 750° C. to change the amorphous IZO film into a crystallized IZO film whose transmittance is greater than 90% at a wavelength of 400 nm.

2. The method of manufacturing a semiconductor light-emitting device according to claim 1, further comprising the step of:
    patterning the amorphous IZO film before the annealing process.

3. The method of manufacturing a semiconductor light-emitting device according to claim 1, further comprising the step of:
    forming a protective layer on the IZO film after the annealing process.

4. The method of manufacturing a semiconductor light-emitting device according to claim 1,
    wherein the annealing process is performed in an atmosphere without $O_2$.

5. The method of manufacturing a semiconductor light-emitting device according to claim 4,
    wherein the annealing process is performed in a $N_2$ atmosphere or a mixed gas atmosphere of $N_2$ and $H_2$.

6. The method of manufacturing a semiconductor light-emitting device according to claim 1,
    wherein the thickness of the IZO film is in the range of 35 nm to 10 µm.

7. The method of manufacturing a semiconductor light-emitting device according to claim 6,
    wherein the thickness of the IZO film is in the range of 100 nm to 1 µm.

* * * * *